United States Patent [19]
Plies

[11] Patent Number: 5,616,920
[45] Date of Patent: Apr. 1, 1997

[54] APPARATUS FOR REMOVING IONS FROM AN ELECTRON BEAM

[75] Inventor: Erich Plies, Tuebingen, Germany

[73] Assignee: Siemens Aktiengesellschaft, Munich, Germany

[21] Appl. No.: 538,865

[22] Filed: Oct. 4, 1995

[30] Foreign Application Priority Data

Oct. 26, 1994 [DE] Germany ............ 44 38 315.0

[51] Int. Cl.$^6$ ................................. H01J 49/48
[52] U.S. Cl. ........................ 250/296; 250/396 R
[58] Field of Search ............... 250/296, 396 R; 378/137, 138

[56] References Cited

U.S. PATENT DOCUMENTS

| | | | |
|---|---|---|---|
| 4,352,021 | 9/1982 | Boyd et al. | 378/12 |
| 4,521,900 | 6/1985 | Rand | 378/137 |
| 4,546,258 | 10/1985 | Chisholm | 250/396 R |
| 4,625,150 | 11/1986 | Rand | 315/111.31 |
| 4,769,543 | 9/1988 | Plies | 250/310 |
| 4,785,176 | 11/1988 | Frosien et al. | 250/396 R |
| 4,835,399 | 5/1989 | Hosaka et al. | 250/396 R |
| 5,041,731 | 8/1991 | Oae et al. | 250/396 R |

OTHER PUBLICATIONS

A Flux Theorem For The Design Of Magnet Coil Ends—Mills et al—Particle Accelerators 1973, vol. 5, pp. 227–235.
Berechung Zusammengesetzter Elektronenoptischer Fokussier—und Ablenksysteme mit uberlagerten Feldern—Teil I. Feldentwicklung und Bahngleichung—E. Plies—Siemens Forsch u. Entwick–Ber. Bd. 11 (1982) Nr. 1.

High–Speed Computed Tomography: Systems and Performance—Peschmann et al—4052—Applied Optics—vol. 24, No. 23—1 Dec. 1985.

Optik—Computation of first–and third–order properties of compound electron–optical lens and deflectro systems Part II: Tests and applications of the computer program–E. Plies et al—83 No. 1 (1989) 11 18.

*Primary Examiner*—Jack I. Berman
*Attorney, Agent, or Firm*—Hill, Steadman & Simpson

[57] ABSTRACT

Purely electrical or magnetic deflection systems are usually utilized in the probe-shaping part of modern electron beam tomographs in order to remove the gas ions generated in the evacuated drift tube by electron impact from the beam. The known deflection systems, however, cause an offset of the electron beam, so that this enters extra-axially into the lens element following the deflection system. In the apparatus for removing ions from an electron beam disclosed herein, a deflection unit (Wien filter) generates an E×B field oriented perpendicular to the beam axis that exerts strong shearing forces only on the positively charged gas ions, but does not influence the electrons. The deflection unit is essentially composed of two tube electrodes lying at a constant potential, of an electrostatic octopole deflector, and two saddle coil pairs annularly surrounding the octopole deflector. The apparatus is useful for fast electron beam tomographs, including x-ray scanners.

10 Claims, 2 Drawing Sheets

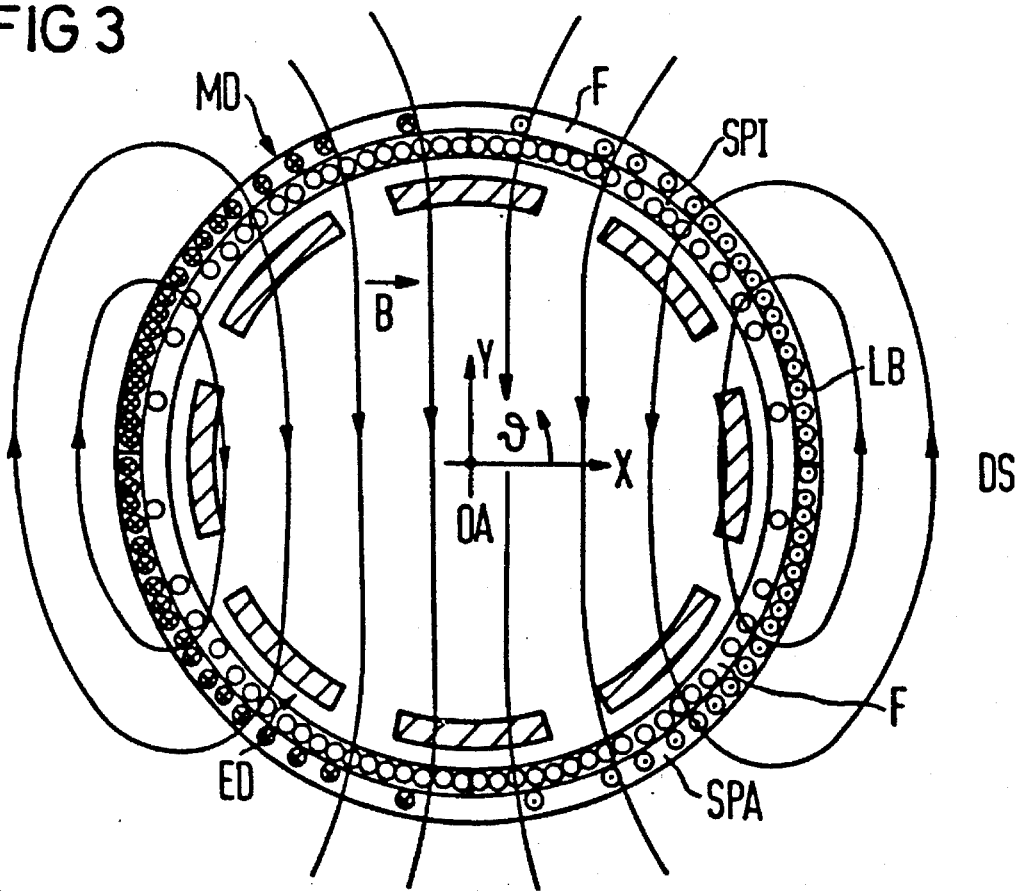

5,616,920

APPARATUS FOR REMOVING IONS FROM AN ELECTRON BEAM

BACKGROUND OF THE INVENTION

The probe-forming part of an electron beam tomograph known from D. P. Boyd et al., U.S. Pat. No. 4,352,021, and K. R. Peschmann et al., Applied Optics 24 (No. 23), December 1985, pp. 4052–4060 is essentially composed of an electron gun, of an evacuated drift tube that expands step-by-step and of a solenoid lens that deflects the electrons out of the beam axis and focuses them on an anode ring serving as an x-ray source. The electron beam should spread as far as possible due to its space charge between the electron gun and the solenoid lens since the size of the electron focus on the anode ring, and thus the size of the x-ray source as well, is inversely proportional to the cross section of the beam entering the solenoid lens. As a consequence of the interaction of the electrons with the residual gasses that are always present in the drift tube, however, positive ions arise that at least partially neutralize the space charge of the beam, and thus reduce the widening thereof.

For resolving this problem, R. E. Rand et al., U.S. Pat. No. 4,521,900, and R. E. Rand et al., U.S. Pat. No. 4,625,150 proposes that the gas ions produced by electron impact be removed from the beam with the assistance of electrical or magnetic deflection systems. The electrostatic deflection system described in R. E. Rand et al., U.S. Pat. No. 4,625,150 is a matter of an improved version of the electrode system known from R. E. Rand et al., U.S. Pat. No. 4,521,900. It makes it possible to generate more uniform electrostatic cross-fields and avoids the deflection of the electron beam. The two anti-parallel, electrical cross-fields, however, effect a dislocation of the electron beam so that it enters the solenoid lens off-axially. This increases the operations of the system (off-axial astigmatism) and complicates the control of the position of the electron focus on the anode ring.

SUMMARY OF THE INVENTION

An object of the invention is to create an apparatus with which ions can be effectively removed from an electron beam. The ion extraction, in particular, should not produce any beam deflection and no beam offset.

According to the invention, an apparatus is provided for removing ions from an electron beam. A first deflection unit is provided for generating a largely uniform electrostatic dipole field. A second deflection unit generates a largely uniform magnetic dipole field. The first and second deflection units have a common symmetry axis. The electrostatic and the magnetic dipole fields are spatially oriented relative to one another such that field vectors reside nearly perpendicularly on one another and respectively comprise no component in a direction of the common symmetry axis. A quotient of an amount of electrostatic field strength and an amount of magnetic field strength is constant along a section of the common symmetry axis and is approximately equal to an amount of average velocity of the electrons running along the symmetry axis.

It can be particularly utilized in the initially cited electron beam tomographs in order to facilitate the beam guidance and control, and in order to reduce the aberrations of the electron optics (axial entry of the electrons into the solenoid lens).

BRIEF DESCRIPTION OF THE DRAWINGS

FIG. 2 illustrates in cross-section (x-y plane) the electrostatic deflector unit that generates an azimuthally rotatable dipole field;

FIG. 3 illustrates in cross-section (x-y plane) the electrical and the magnetic deflection unit.

DESCRIPTION OF THE PREFERRED EMBODIMENTS

Figure 1:
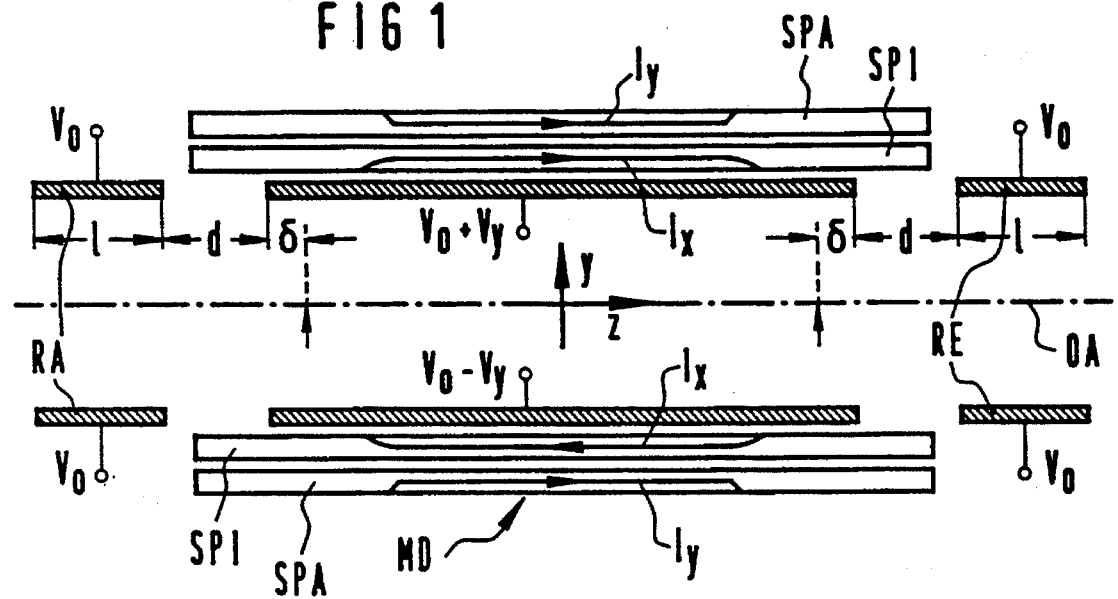
FIG. 1 illustrates in longitudinal section (y-z plane) the electrode and coil system of the apparatus generating an E×B dipole field.

The apparatus for removing ions from an electron beam propagating in the direction of the optical axis OA which is shown in FIG. 1 is essentially composed of an electrostatic deflection unit ED, of a magnetic deflection unit MD comprising an inner and an outer saddle coil pair SPI, SPA, and two tube electrodes RA and RE lying at a constant potential $V_0$ that are respectively arranged at the distance d preceding or following the deflection units that generate an E×B field oriented perpendicular to the beam axis OA.

As FIG. 2 shows, the electrostatic deflection unit ED has a rotational-symmetrical structure with reference to the beam axis OA. Its eight electrodes charged with the potentials $$V_i = V_o + V_x \cos \theta_i + V_y \sin \theta_i$$

$$\theta_i: \text{azimuth angle } (\theta_i = 0°, 45°, 90°, \ldots) \quad (1)$$

generate a uniform, transverse electrostatic dipole field without higher multipole components. When the electrostatic potential $\phi$ is written in the form (see, for example E. Plies, Siemens Forschungs-und Entwicklungsberichte d. 11 (1982) Nr. 1, pp. 38–45)

$$\phi := \phi_0 = \sum_{\nu=0}^{\infty} \phi_{2\nu+1} \quad (2)$$

with the multipole components $$\phi_{2\nu+1} = r^{2\nu+1} \{ f_{2\nu+1}(z,r) \cos [(2\nu+1)\theta] + g_{2\nu+1}(z,r) \sin [(2\nu+1)\theta] \} \quad (3)$$

then $$\phi_0 = V_0, \phi_3 = \phi_5 = 0, \phi_7 \neq 0,$$

applies for the eight-electrode element, whereas even the decipole term no longer disappears ($\phi_5 \neq 0$) for the electrode system known from R. E. Rand et al., U.S. Pat. No. 4,625,150. The potential $V_0$ is advantageously selected such that all electrodes lie at a negative potential. In the case of a pure x–deflection field ($V_y = 0$), for example, the potential can be given the value $V_0 = -V_x$.

The two saddle coil pairs SPI and SPA that annularly surround the electrostatic deflection unit ED generate a transverse magnetic dipole field that is oriented perpendicular to the electrical dipole field ($\overline{E} \perp \overline{B}$) and, like this, comprises no component in the direction of the beam axis OA ($B_z = 0$, $E_z = 0$). Since the interconnects LB of the saddle coil pairs SPI, SPA embedded in a flexible insulating compound are distributed in the x-y plane according to the relationship $$(dN/d\theta)SPA = const. \cos \theta$$

$$(dN/d\theta)SPI = const. \sin \theta \quad (4a)$$

an extremely uniform magnetic dipole field without higher multipole components builds up inside the deflection unit (see, for example, E. Plies, Siemens Forschungs-und Entwicklungsberichte Bd. 11(1982) Nr. 1, pp. 38–45). FIG. 3 shows the magnetic field $\bar{B}$ generated by the outer saddle coil pair SPA, whereby the direction of the current $I_y$ respectively flowing in the outer interconnects LB is thereby indicated, as usual, by crosses or dots within the individual interconnect cross sections. The magnetic dipole field generated by the current-permeated, inner saddle coil pair SPI is obtained in a simple way by rotating the illustrated field distribution by 90°.

As set forth above, the two deflection units ED, MD generate purely transverse dipole fields orthogonal relative to one another (E×B field). Their field strengths $E_0$ and $B_0$ are matched to one another such that the electrons entering into the system experience no deflection or offset, and strong shearing forces act only on the ions present in the beam.

For deriving the matching or balancing conditions required therefor, let the following proceed on the basis of an electrical deflection field $$\bar{E}=E_x(0, 0, z)\bar{e}_x+E_y(0, 0, z)\bar{e}_y \quad (5)$$

and a magnetic deflection field $$\bar{B}=B_x(0, 0, z)\bar{e}_x+B_y(0, 0, z)\bar{e}_y \quad (6)$$

on the beam axis OA. The force acting on an electron in such a field is calculated as $$\bar{F}_e=-e\cdot(\bar{E}+\bar{v}_e\times\bar{B}), \quad (7)$$

where e references the elementary charge and $\bar{v}$ indicates the electron velocity. Since the velocity v comprises only one component in beam direction ($\bar{v}_e=v_e\cdot\bar{e}_z$), (7), taking (5) and (6) into consideration, can be converted to $$\bar{F}_e=-e\{[E_x(0, 0, z)-v_e\cdot B_y(0, 0, z)]\cdot\bar{e}_x+[E_y(0, 0, z)+v_e\cdot B_x(0, 0, z)]\cdot\bar{e}_y\} \quad (8)$$

When no force is to act on the electron, the field strengths must satisfy the condition $$E_x(0, 0, z)/B_y(0, 0, z)=v_e \quad (9a)$$

and $$E_y(0, 0, z)/B_x(0, 0, z)=-v_e \quad (9b)$$

which can be achieved without ado by matching the electron potentials $V_i$ and of the currents $I_x$ or $I_y$ flowing in the saddle coils SPI, SPA. Since the above-recited matching or balancing condition is not satisfied for the gas ions entering into the system or generated therein, the positively charged ions experience a deflection transversely relative to the beam direction. The forces $\bar{F}_i$ acting on an ion (charge q>0) with the velocity $\bar{v}_i=v_i\bar{e}_z$, $|v_i|\gg v_e$ are thus calculated as $$\bar{F}_i=q\cdot(\bar{E}+\bar{v}_i\times\bar{B})=\begin{cases}\bar{F}_i=q\cdot\left(\bar{E}-v_i\cdot B\cdot\dfrac{\bar{E}}{E}\right) & v_i>0 \quad (10a)\\ \bar{F}_i=q\cdot\bar{E}, & v_i=0 \quad (10b)\\ \bar{F}_i=q\cdot\left(\bar{E}+v_i\cdot B\dfrac{\bar{E}}{E}\right) & v_i<0 \quad (10c)\end{cases}$$

The forces, regardless of the ion velocity, always differ from 0 and are directed perpendicular to the beam axis OA. A deflection also occurs when the gas ion moves opposite the beam direction ($v_i$>0).

Figure 4:
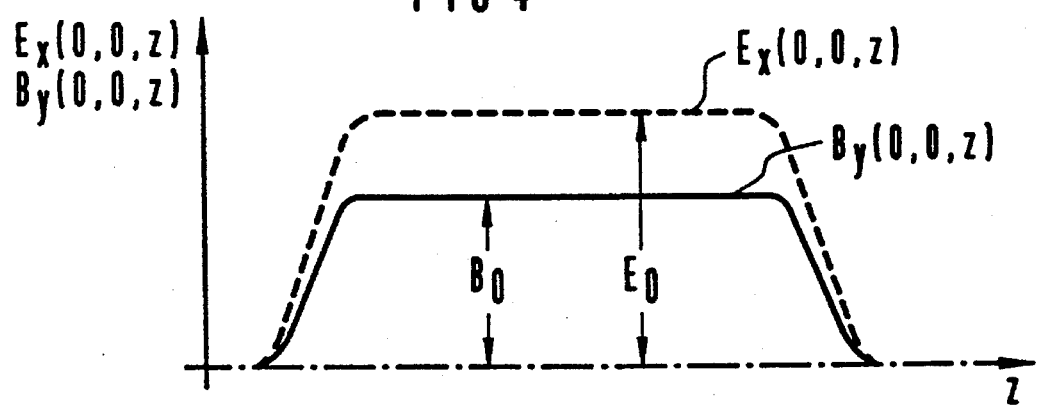
FIG. 4 shows the axial distribution of the electrostatic and magnetic deflection fields.

On the basis of a suitable selection of the length 1 of the tube electrodes RA, RE (see FIG. 1), their distance d from the electrostatic deflection unit ED and the parameter δ(distance of the middle of the head coil region from the headpiece of the electrostatic deflection unit; see FIG. 1 in F. E. Mills, G. H. Morgan, Particle Accelerators 5 (1973), 227), it can be established that the condition $$E_x(0, 0, z)/B_y(0, 0, z)=E_y(0, 0, z)/(-B_x(0, 0, z))=E_0/B_0=v_e \quad (11)$$

for the Wien filter is satisfied not only in the principal field but also in the edge area. The electrostatic and magnetic deflection field then has an axial distribution as shown, for example, in FIG. 4.

The potential occupation of the deflection electrodes established by Equation (1) allows a static and a dynamic rotation of the electrical dipole field in the x-y plane. Since the magnetic dipole field must be correspondingly co-rotated, two saddle coil pairs SPI, SPA are also provided for the x-deflection and y-deflection in the described apparatus. One saddle coil pair can be eliminated when one forgoes the rotatability of the dipole fields. This is especially the case when the deflection unit shown in FIG. 1 is replaced by the electrode system known from R. E. Rand et al., U.S. Pat. No. 4,625,150.

Although various minor changes and modifications might be proposed by those skilled in the art, it will be understood that my wish is to include within the claims of the patent warranted hereon all such changes and modifications as reasonably come within my contribution to the art.

I claim as my invention:

1. An apparatus for removing ions from an electron beam, comprising:

a first deflection unit for generating a substantially uniform electrostatic dipole field;

a second deflection unit for generating a substantially uniform magnetic dipole field;

the first and second deflection units comprising a common symmetry axis;

the electrostatic and the magnetic dipole fields being spatially oriented relative to one another such that corresponding field vectors of the two fields reside nearly perpendicularly on one another and respectively comprise no component in a direction of the common symmetry axis;

a quotient of a magnitude of an electrostatic field strength of the electrostatic field and a magnitude of a magnetic field strength of the magnetic field being constant along a section of the common symmetry axis and being approximately equal to an average velocity of electrons running along the symmetry axis; and the first deflection unit, as viewed in an axial direction, being arranged between two tube electrodes lying at a constant negative potential.

2. An apparatus according to claim 1 wherein an electrostatic multipole element is provided as said first deflection unit.

3. An apparatus according to claim 2 wherein the electrostatic multipole element comprises four electrodes.

4. An apparatus according to claim 2 wherein the electrostatic multipole element comprises eight electrodes.

5. An apparatus according to claim 1 wherein the second deflection unit comprises at least one saddle coil pair that annularly surround the first deflection unit.

6. An apparatus according to claim 1 wherein the second deflection unit comprises two saddle coil pairs that annularly surround the first deflection unit.

7. An apparatus according to claim 5, wherein the saddle coils are arranged on the first deflection unit.

8. An apparatus according to claim 5 wherein a plurality of current-carrying elements of the saddle coil pair comprise a cosine distribution per angular unit oriented in a plane perpendicular to the symmetry axis.

9. An apparatus according to claim 5 wherein a plurality of current-carrying elements of the saddle coil pair comprise a sine distribution per angular unit oriented in a plane perpendicular to the symmetry axis.

10. An apparatus for removing ions from an electron beam, comprising:

a deflection system for removing the ions from the electron beam, the deflection system comprising first and second deflection units:

the first deflection unit comprising multiple electrodes arranged in a circle for generating a uniform electrostatic dipole field;

the second deflection unit comprising saddle coils surrounding the first deflection unit for generating a uniform magnetic dipole field;

the first and second deflection units comprising a common symmetry axis;

the electrostatic and the magnetic dipole fields being spatially oriented relative to one another such that corresponding field vectors of the two fields reside substantially perpendicularly on one another and respectively comprise substantially no component in a direction of the common symmetry axis;

a quotient of a magnitude of an electrostatic field strength of the electrostatic field and a magnitude of a magnetic field strength of the magnetic field being constant along a section of the common symmetry axis and being approximately equal to a value of an average velocity of electrons running along the symmetry axis; and the first deflection unit, as viewed along the symmetry axis, being arranged between two tube electrodes lying at a same constant negative potential, said tube electrodes being formed as tubes which are completely open at both opposite ends.

* * * * *